United States Patent
Hashimoto et al.

(10) Patent No.: US 10,763,101 B2
(45) Date of Patent: Sep. 1, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yoshitomo Hashimoto, Toyama (JP); Takafumi Nitta, Toyama (JP); Hiroki Yamashita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/248,392

(22) Filed: Jan. 15, 2019

(65) Prior Publication Data

US 2019/0221425 A1 Jul. 18, 2019

(30) Foreign Application Priority Data

Jan. 17, 2018 (JP) .................................. 2018-005763

(51) Int. Cl.
*H01L 21/02* (2006.01)
*C23C 16/52* (2006.01)
(Continued)

(52) U.S. Cl.
CPC ...... *H01L 21/02126* (2013.01); *C23C 16/045* (2013.01); *C23C 16/36* (2013.01);
(Continued)

(58) Field of Classification Search
CPC ......... H01L 21/02126; H01L 21/02167; C23C 16/45553; C23C 16/045
See application file for complete search history.

(56) References Cited

U.S. PATENT DOCUMENTS 10,043,796 B2 * 8/2018 Machkaoutsan ..............................
H01L 21/823487
10,145,008 B2 * 12/2018 Chandra ........... H01L 21/02337
(Continued)

FOREIGN PATENT DOCUMENTS

JP 2005-123275 A 5/2005
JP 2011-238894 A 11/2011
(Continued)

OTHER PUBLICATIONS

Korean Office Action dated Mar. 13, 2020 for the Korean Patent Application No. 10-2019-0005703.

*Primary Examiner* — William Coleman
(74) *Attorney, Agent, or Firm* — Volpe and Koenig, P.C.

(57) ABSTRACT

There is provided a technique that includes forming a first film including a ring-shaped structure composed of silicon and carbon and containing nitrogen so as to fill a recess formed in a surface of a substrate by performing a cycle a predetermined number of times, and performing post-treatment by supplying an oxidizing agent to the substrate under a condition that the ring-shaped structure included in the first film is preserved. The cycle includes non-simultaneously performing supplying a precursor including the ring-shaped structure and containing halogen to the substrate with the recess formed in the surface, and supplying a nitriding agent to the substrate, wherein the cycle is performed under a condition that the ring-shaped structure included in the precursor is preserved.

18 Claims, 7 Drawing Sheets

(51) Int. Cl.
*C23C 16/36* (2006.01)
*C23C 16/56* (2006.01)
*C23C 16/04* (2006.01)
*C23C 16/455* (2006.01)

(52) U.S. Cl.
CPC ........ *C23C 16/45553* (2013.01); *C23C 16/52* (2013.01); *C23C 16/56* (2013.01); *H01L 21/0223* (2013.01); *H01L 21/0234* (2013.01); *H01L 21/02167* (2013.01); *H01L 21/02208* (2013.01); *H01L 21/02211* (2013.01); *H01L 21/02247* (2013.01); *H01L 21/02326* (2013.01); *H01L 21/02337* (2013.01)

(56) References Cited

U.S. PATENT DOCUMENTS

| | | |
|---|---|---|
| 2005/0196533 A1 | 9/2005 | Hasebe et al. |
| 2011/0256733 A1* | 10/2011 | Hirose .................... C23C 16/30 438/770 |
| 2014/0073142 A1* | 3/2014 | Hirose .................... C23C 16/30 438/762 |
| 2014/0080318 A1* | 3/2014 | Hirose .................... C23C 16/24 438/778 |
| 2014/0170858 A1* | 6/2014 | Harada ................ C23C 16/308 438/758 |
| 2017/0221698 A1 | 8/2017 | Hashimoto et al. |
| 2017/0250211 A1* | 8/2017 | Chang ................ H01L 27/1463 |
| 2018/0023192 A1 | 1/2018 | Chandra et al. |

FOREIGN PATENT DOCUMENTS

| | | |
|---|---|---|
| JP | 2014-056871 A | 3/2014 |
| KR | 20170091528 A | 8/2017 |
| WO | 2016/126911 A2 | 8/2016 |

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2018-005763, filed on Jan. 17, 2018, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a film such as a silicon oxycarbonitride film (SiOCN film) on a substrate is often carried out. A process of forming a film such as a silicon boron carbonitride film (SiBCN film) including a borazine ring skeleton on a substrate is also often carried out.

SUMMARY

Some embodiments of the present disclosure provide a technique capable of forming a seamless and void-free film on a substrate with recesses such trenches and holes formed on its surface.

According to one embodiment of the present disclosure, there is provided a technique including: forming a first film including a ring-shaped structure composed of silicon and carbon and containing nitrogen so as to fill a recess formed in a surface of a substrate by performing a cycle a predetermined number of times, the cycle including non-simultaneously performing: supplying a precursor including the ring-shaped structure and containing halogen to the substrate with the recess formed in the surface; and supplying a nitriding agent to the substrate, wherein the cycle is performed under a condition that the ring-shaped structure included in the precursor is preserved; and performing post-treatment by supplying an oxidizing agent to the substrate under a condition that the ring-shaped structure included in the first film is preserved.

DETAILED DESCRIPTION

A CVD (Chemical Vapor Deposition) method commonly known as a deposition method is not isotropic in terms of a deposition rate with respect to a three-dimensional substrate surface. When a film is formed on a substrate surface which is not planar, e.g., a substrate surface on which trench-shape patterns, hole-shaped patterns or both thereof were formed, it is difficult for the existing CVD method to control film thickness in trenches or holes. In particular, in the trenches or holes, the film thickness of the bottom portion becomes thinner than the film thickness of the top portion, generating a film thickness difference (i.e., decreasing a step coverage). This is because it is difficult to uniformly supply molecules reacted in gas phase to various portions of grooves in the CVD method. Further, it is known that a pattern having a larger aspect ratio in the trench or hole shape results in a larger film thickness difference between the bottom portion and the top portion (deterioration of the step coverage). Furthermore, film formation on the top portion of patterns such trenches or holes proceeds at a higher speed than the bottom portion thereof. Therefore, if an opening is blocked, supply of molecules or a precursor gas reacted in gas phase to the patterns such as trenches or holes may be inhibited after the blocking, thereby generating seams or voids.

On the other hand, it is conceivable to form a film using an ALD (Atomic Layer Deposition) method which can obtain an isotropic deposition rate with respect to a three-dimensional substrate surface. However, this method may have the above-described problem of blocking of the top portion of the patterns such as trenches or holes having a reverse tapered shape.

Further, after forming a film having a predetermined film thickness on a pattern, a method for controlling a film shape in the pattern by etching the film or method of repeating the above-mentioned film formation and etching (Deposition etching) plural times may be used. However, these methods increase the time required to obtain a film having both the desired thickness and shape compatible with each other. Further, since there is a need for an etching apparatuses as well as a film forming apparatus, there is a problem of deterioration of production efficiency and increase in production costs.

In order to overcome the above problems, the inventors have found that a precursor including a ring-shaped structure composed of Si and C and containing chlorine (Cl) as halogen, and a nitriding agent are used to form a SiCN film including the ring-shaped structure composed of Si and C so as to fill a recess such as a trench or hole formed in the surface of a substrate, and the SiCN film is converted into a SiOC film by performing post-treatment on the SiCN film under an O-containing atmosphere, at which time the film thickness increases (expands), thereby removing seams or voids generated in the SiCN film. The present disclosure is made based on the above findings of the inventors.

Embodiments of the Present Disclosure

One embodiment of the present disclosure will be now described with reference to FIGS. 1 to 5.

(1) Configuration of Substrate Processing Apparatus

Figure 1:
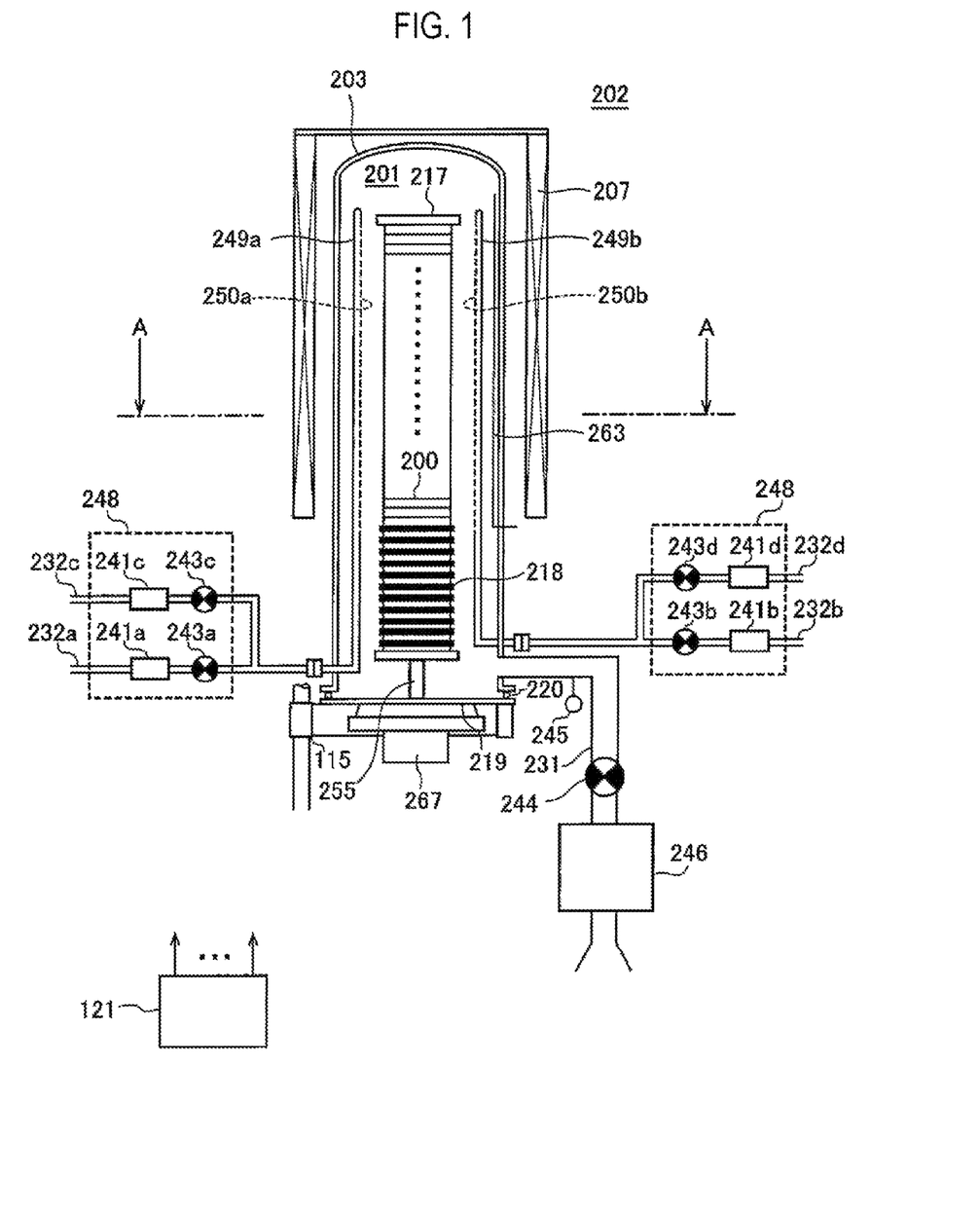
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating mechanism (a temperature adjustment part). The heater 207 has a cylindrical shape and is supported by a support plate so as to be vertically installed. The heater 207 functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as quartz ($SiO_2$) or silicon carbide and is formed in a cylindrical shape with its upper end closed and its lower end opened. A process chamber 201 is formed in the hollow cylindrical portion of the reaction tube 203. The process chamber 201 is configured to be able to accommodate wafers 200 as substrates.

Nozzles 249a and 249b are installed in the process chamber 201 so as to pass through the lower side wall of the reaction tube 203. Gas supply pipes 232a and 232b are connected to the nozzles 249a and 249b, respectively.

Mass flow controllers (MFCs) 241a and 241b, which are flow rate controllers (flow rate controlling parts), and valves 243a and 243b, which are opening/closing valves, are installed in the gas supply pipes 232a and 232b, respectively, in this order from the upstream side. Gas supply pipes 232c and 232d are connected to the downstream side of the valves 243a and 243b of the gas supply pipes 232a and 232b, respectively. MFCs 241c and 241d and valves 243c and 243d are installed in the gas supply pipes 232c and 232d, respectively, in this order from the upstream side.

Figure 2:
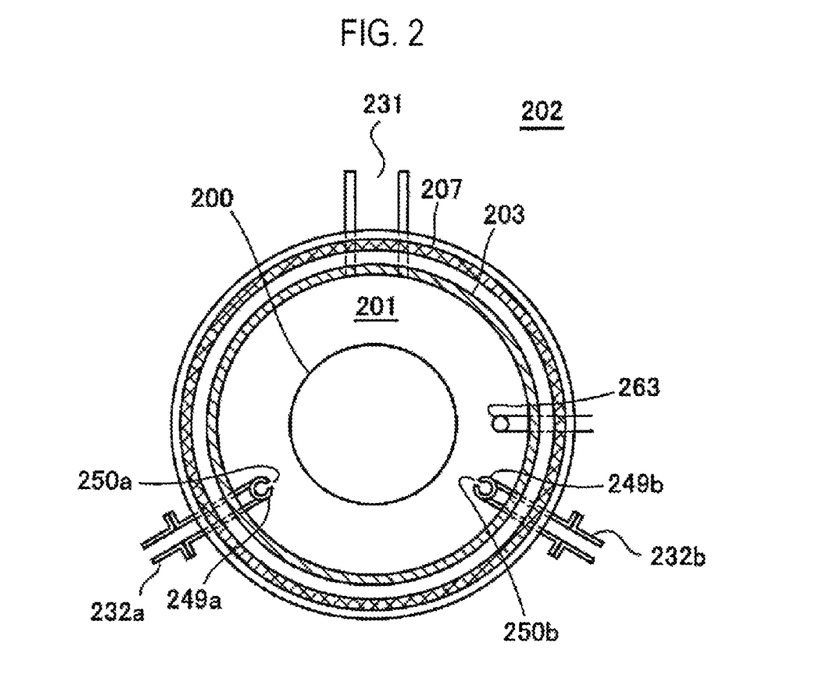
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 2, the nozzles 249a and 249b are disposed in an annular space, when viewed in a plan view, between the inner wall of the reaction tube 203 and the wafers 200 such that the nozzles 249a and 249b extend upward along a stack direction of the wafers 200 from the lower portion of the inner wall of the reaction tube 203 to the upper portion thereof. Specifically, the nozzles 249a and 249b are installed in a region horizontally surrounding a wafer arrangement region in which the wafers 200 are arranged at the lateral side of the wafer arrangement region, along the wafer arrangement region. Gas supply holes 250a and 250b for supplying a gas are respectively formed on the side surfaces of the nozzles 249a and 249b. The gas supply holes 250a and 250b are opened toward the center of the reaction tube 203 to allow the gas to be supplied toward the wafers 200. A plurality of gas supply holes 250a and 250b may be formed between the lower portion of the reaction tube 203 and the upper portion thereof.

Figure 5:
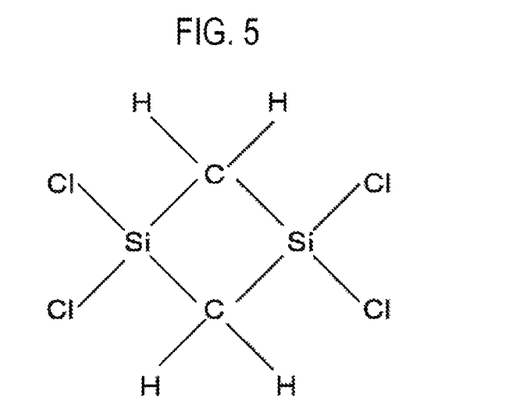
FIG. 5 is a view showing the chemical structural formula of 1,1,3,3-tetrachloro-1,3-disilacyclobutane used as a precursor.

A precursor, for example, a gas having a ring-shaped structure composed of Si and C and containing halogen, is supplied from the gas supply pipe 232a into the process chamber 201 via the MFC 241a, the valve 243a and the nozzle 249a. The precursor acts as a Si source and a C source. An example of the precursor may include a 1,1,3,3-tetrachloro-1,3-disilacyclobutane ($C_2H_4Cl_4Si_2$, abbreviation: TCDSCB) gas. FIG. 5 shows the chemical structural formula of TCDSCB. TCDSCB has a ring-shaped structure composed of Si and C and contains chlorine (Cl) as halogen. Hereinafter, the ring-shaped structure composed of Si and C is also simply referred to as a ring-shaped structure for the sake of convenience. The shape of the ring-shaped structure included in TCDSCB is square. The ring-shaped structure is formed with Si and C bonded alternately, including four Si—C bonds and two Si atoms and two C atoms. In the ring-shaped structure, Cl is bonded to Si, and hydrogen (H) is bonded to C. That is, the TCDSCB includes Si—Cl bonds and C—H bonds in addition to the Si—C bonds.

A reactant, for example, a nitrogen (N)-containing gas, is supplied from the gas supply pipe 232b into the process chamber 201 via the MFC 241b, the valve 243b and the nozzle 249b. An example of the N-containing gas may include a hydrogen nitride-based gas as a nitriding agent (nitriding gas). The hydrogen nitride-based gas may be a substance containing N and H and consisting of two elements of N and H and acts as an N source. An example of the hydrogen nitride-based gas may include an ammonia ($NH_3$) gas.

A reactant, for example, an oxygen (O)-containing gas, is supplied from the gas supply pipe 232b into the process chamber 201 via the MFC 241b, the valve 243b and the nozzle 249b. The O-containing gas acts as an oxidizing agent (oxidizing gas), that is, an O source. An example of the O-containing gas may include an oxygen ($O_2$) gas.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b. The nitrogen ($N_2$) gas acts as a purge gas, a carrier gas, a dilution gas or the like.

A precursor supply system is mainly constituted by the gas supply pipe 232a, the MFC 241a and the valve 243a. A reactant (N-containing gas or O-containing gas) supply system is mainly constituted by the gas supply pipe 232b, the MFC 241b and the valves 243b. The N-containing gas supply system functions as a nitriding agent supply system in a film forming process to be described later. The O-containing gas supply system functions as an oxidizing agent supply system in a post-treatment step to be described later. An inert gas supply system is mainly constituted by the gas supply pipes 232c and 232d, the MFCs 241c and 241d and the valves 243c and 243d.

Either or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d and is configured such that the operations of supplying various gases into the gas supply pipes 232a to 232d, such as the opening and closing operation of the valves 243a to 243d and the flow rate regulating operation by the MFCs 241a to 241d, and the like, are controlled by a controller 121 which will be described later. The integrated supply system 248 is configured as an integral type or division type integrated unit and can be attached to and detached from the gas supply pipes 232a to 232d or the like on an integrated unit basis. Further, the maintenance, replacement, extension and the like of the integrated supply system 248 can be performed on an integrated unit basis.

An exhaust pipe 231 for exhausting the internal atmosphere of the process chamber 201 is connected to the lower side of the side wall of the reaction tube 203. A vacuum exhaust device, e.g., a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting the opening degree of the valve based on pressure information detected by the pressure sensor 245 while the vacuum pump 246 is actuated. An exhaust system is mainly constituted by the exhaust pipe 231, the APC valve 244 and the pressure sensor 245. The vacuum pump 246 may be included in the exhaust system.

A seal cap 219, which serves as a furnace opening cover configured to hermetically seal the lower end opening of the reaction tube 203, is installed under the reaction tube 203. The seal cap 219 is made of metal such as, e.g., SUS or the like, and is formed in a disc shape. An O-ring 220, which is a seal member making contact with the lower end of the reaction tube 203, is installed on the upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument installed outside the reaction tube 203. The boat elevator 215 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
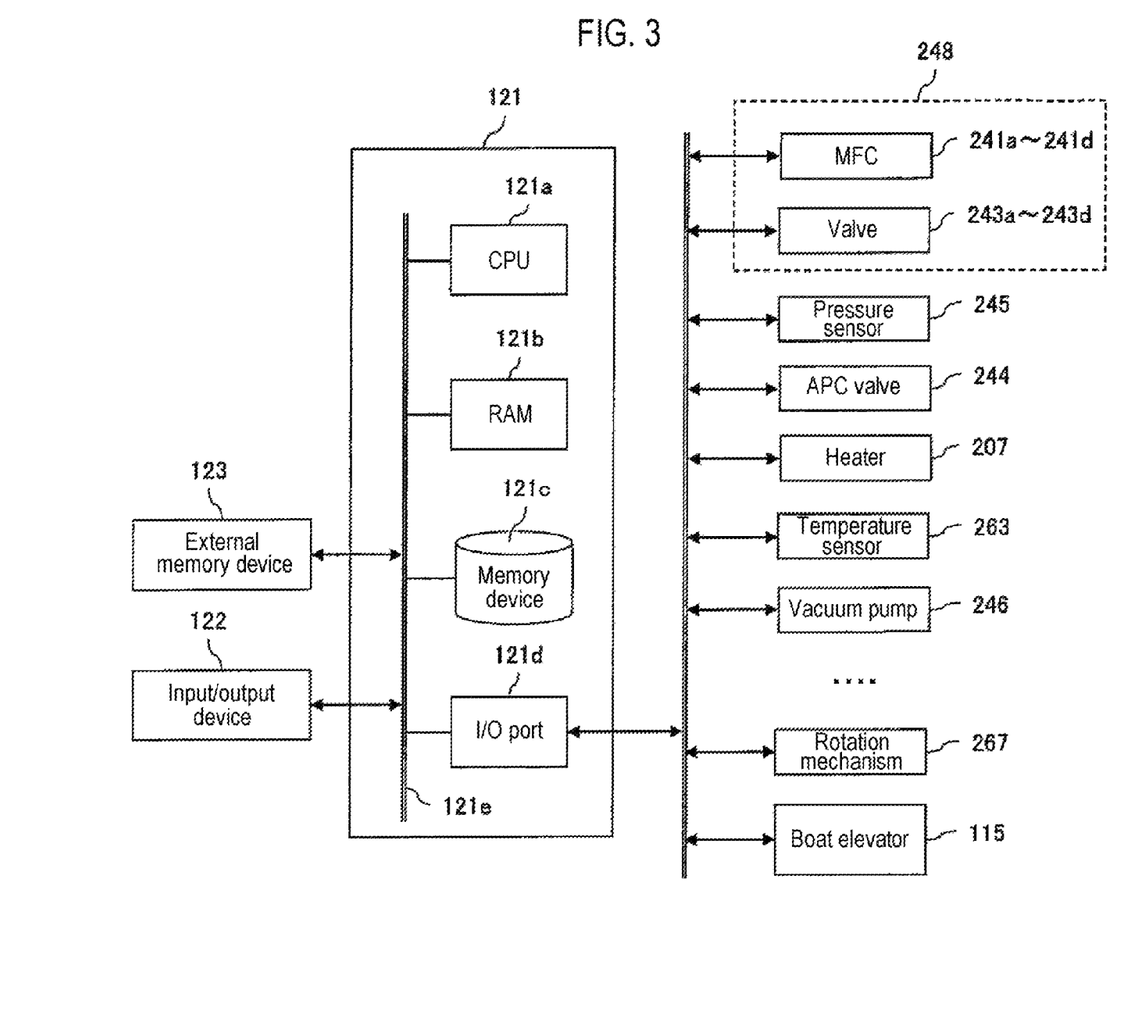
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a controlling part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe functions as a program for causing the controller 121 to execute each sequence in the substrate processing process, which will be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and so on.

The CPU 121a is configured to read and execute the control program from the memory device 121c. The CPU 121a also reads the recipe from the memory device 121c according to an input of an operation command from the input/output device 122. The CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and so on, according to contents of the read recipe.

The controller 121 may be configured by installing, on a computer, the aforementioned program stored in an external memory device 123 which includes, for example, a magnetic disk such as a hard disk, an optical disk such as a CD, a magneto-optical disk such as an MO, a semiconductor memory such as a USB memory, or the like. The memory device 121c or the external memory device 123 is configured as a non-transitory computer-readable recording medium. Hereinafter, the memory device 121c and the external memory device 123 will be generally and simply referred to as a "recording medium". When the term "recording medium" is used herein, it may indicate a case of including only the memory device 121c, a case of including only the external memory device 123, or a case of including both the memory device 121c and the external memory device 123. Alternatively, the program may be supplied to the computer using communication means such as the Internet or a dedicated line, instead of using the external memory device 123.

(2) Substrate Processing Process

A sequence example of forming a silicon oxycarbide film on a wafer 200 as a substrate with recesses such as trenches or holes formed on its surface using the aforementioned substrate processing apparatus, which is one of the processes for manufacturing a semiconductor device, will be mainly described below with reference to FIG. 4. In the following description, the operations of the respective parts constituting the substrate processing apparatus are controlled by the controller 121.

Figure 4:
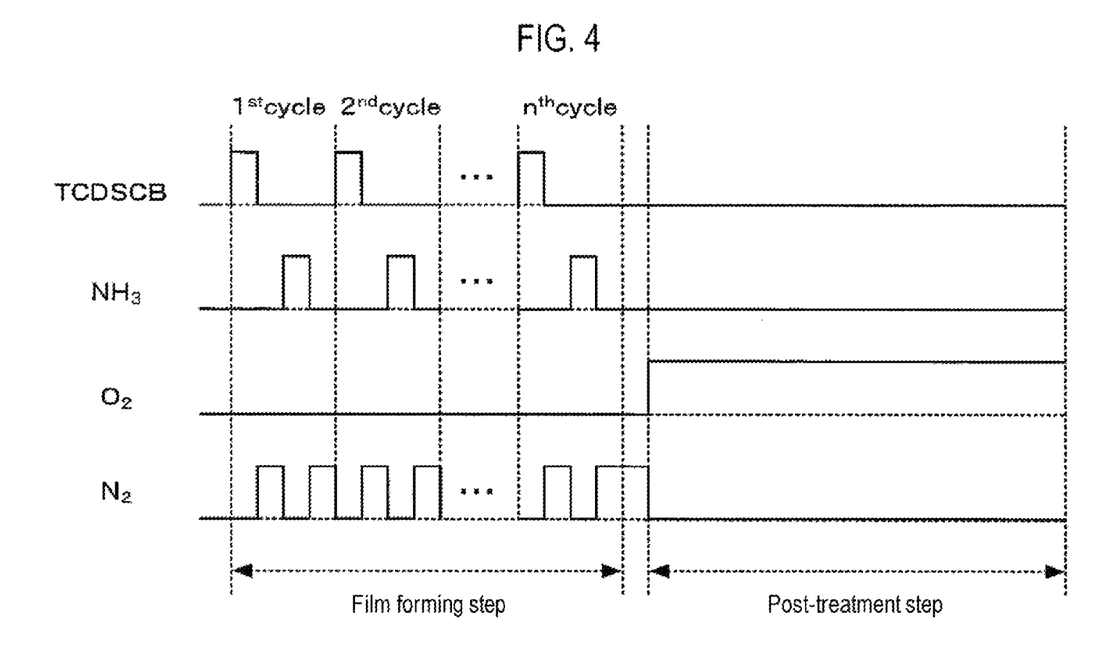
FIG. 4 is a diagram showing a film forming sequence according to an embodiment of the present disclosure.

The substrate processing sequence shown in FIG. 4 includes a film forming step of forming a first film including a ring-shaped structure composed of Si and C and containing N so as to fill a recess formed in the surface of a wafer 200 by performing a cycle a predetermined number of times under a condition that the ring-shaped structure composed of Si and C included in a TCDSCB gas is preserved, the cycle including non-simultaneously performing a step 1 of supplying a TCDSCB gas as a precursor including a ring-shaped structure composed of Si and C and containing Cl as halogen to the wafer 200 with the recess formed in the surface and a step 2 of supplying an $NH_3$ gas as a nitriding agent to the wafer 200, and a post-treatment step of performing post-treatment by supplying an $O_2$ gas as an oxidizing agent to the wafer 200 under a condition that the ring-shaped structure composed of Si and C included in the first film is preserved.

The first film formed in the film forming step is a film containing Si, C and N and containing no O, that is, a silicon carbonitride film (SiCN film). In the film forming step, N contained in the $NH_3$ gas is introduced into the first film in a state where H is bonded to N.

In the post-treatment step, the first film is oxidized to be converted into a second film including a ring-shaped structure composed of Si and C and containing O. The second film is a film containing Si, C and O, that is, a silicon oxycarbide film (SiOC film). In the post-treatment step, the first film is converted into the second film by substituting N contained in the first film with O contained in the $O_2$ gas. This makes the second film thicker than the first film.

In the present disclosure, the substrate processing sequence shown in FIG. 4 may be expressed as follows for the sake of convenience. The same notation is used for substrate processing sequences in modifications to be described later.

$(TCDSCB \rightarrow NH_3) \times n \rightarrow O2 \Rightarrow SiOCN$

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer." When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, namely, a space in which the wafers 200 exist, is vacuum-exhausted (de-pressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature (first temperature). In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The actuation of the vacuum pump 246 and the heating and rotation of the wafers 200 may be continuously performed at least until the processing of the wafers 200 is completed.

(Film Forming Step)

Thereafter, the following steps 1 and 2 are sequentially executed.

[Step 1]

In this step, a TCDSCB gas is supplied to the wafers 200 in the process chamber 201. Specifically, the valve 243a is opened to flow the TCDSCB gas into the gas supply pipe 232a. The flow rate of the TCDSCB gas is adjusted by the MFC 241a and the TCDSCB gas is supplied into the process chamber 201 via the nozzle 249a and is exhausted from the exhaust pipe 231. At this time, the TCDSCB gas is supplied to the wafers 200. At this time, the valves 243c and 243d may be opened to flow an $N_2$ gas into the gas supply pipes 232c and 232d.

The process conditions of this step are exemplified as follows.

Processing temperature (first temperature): 200 to 400 degrees C., specifically 250 to 350 degrees C.

Processing pressure: 1 to 20 Torr (133 to 2,666 Pa)

TCDSCB gas supply flow rate: 1 to 2,000 sccm $N_2$ gas supply flow rate (per gas supply pipe): 0 to 10,000 sccm Each gas supply time: 1 to 120 seconds, specifically 5 to 60 seconds In the present disclosure, the notation of a numerical range such as "200 to 400 degrees C." means that the lower limit value and the upper limit value are included in the range. For example, "200 to 400 degrees C." means "equal to or higher than 200 degrees C. and equal to or lower than 400 degrees C.". The same applies to other numerical ranges.

The above-mentioned process conditions, particularly the temperature conditions (processing temperature 200 to 400 degrees C.), are the conditions that at least a part of the ring-shaped structure composed of Si and C included in TCDSCB can be preserved (maintained) without being destructed. That is, the above-mentioned process conditions are the conditions that at least a part of a plurality of ring-shaped structures included in the TCDSCB gas (plural TCDSCB molecules) supplied to the wafers 200 is preserved as it is without being destructed. In the present disclosure, a ring-shaped structure composed of Si and C is also simply referred to as a ring-shaped structure.

By supplying the TCDSCB gas to the wafers 200 under the above-mentioned conditions, a first layer (initial layer) including a ring-shaped structure and containing Cl as halogen is formed on the outermost surface of the wafer(s) 200. That is, a layer including a ring-shaped structure composed of Si and C and containing Cl is formed as the first layer. At least a part of the plurality of ring-shaped structures included in the TCDSCB gas is introduced, as it is without being destructed, into the first layer. In addition, the first layer may include a chain structure generated when some of a plurality of Si—C bonds constituting a ring-shaped structure is broken. Further, the first layer may include at least one of a Si—Cl bond and a C—H bond.

After forming the first layer on the wafer 200, the valve 243a is closed to stop the supply of TCDSCB gas into the process chamber 201. Then, the interior of the process chamber 201 is vacuum-exhausted to exclude the gas or the like remaining in the process chamber 201 from the interior of the process chamber 201. At this time, the valves 243c and 243d are opened to supply an $N_2$ gas into the process chamber 201. The $N_2$ gas acts as a purge gas.

An example of the precursor may include a 1,1,3,3-tetrachloro-1,3-disilacyclopentane ($C_3H_6Cl_4Si_2$) gas in addition to the TCDSCB gas. That is, the shape of the ring-shaped structure composed of Si and C included in the precursor is not limited to square. In addition, this ring-shaped structure is not limited to a case where Si and C are alternately bonded. Another example of the precursor may include a 1,1,3,3-tetrafluoro-1,3-disilacyclobutane ($C_2H_4F_4Si_2$) gas. That is, halogen contained in the precursor is not limited to Cl but may be fluorine (F), bromine (Br) or iodine (I).

An example of the inert gas may include a rare gas such as an Ar gas, a He gas, a Ne gas or a Xe gas, in addition to the $N_2$ gas. The same applies to the step 2 and the post-treatment step to be described below.

[Step 2]

After the step 1 is completed, an $NH_3$ gas is supplied to the wafer 200 in the process chamber 201, that is, to the first layer formed on the wafer 200. Specifically, the opening/closing control of the valves 243a, 243c and 243d is performed in the same procedure as the opening/closing control of the valves, 243a, 243c and 243d in the step 1. The flow rate of the $NH_3$ gas is adjusted by the MFC 241b, and the $NH_3$ gas is supplied into the process chamber 201 via the nozzle 249b and is exhausted from the exhaust pipe 231. At this time, the $NH_3$ gas is supplied to the wafer 200.

The process conditions of this step are exemplified as follows.

Processing temperature (first temperature): 200 to 400 degrees C., specifically 250 to 350 degrees C.

Processing pressure: 1 to 30 Torr (133 to 3,999 Pa)

$NH_3$ gas supply flow rate: 100 to 10,000 sccm

Gas supply time: 1 to 120 seconds

Other process conditions are the same as the process conditions in the step 1.

The above-mentioned process conditions, particularly the temperature conditions (processing temperature 200 to 400 degrees C.), are the conditions that at least a part of the ring-shaped structure composed of Si and C included in the first layer formed on the wafer 200 in the step 1 can be preserved (maintained) without being destructed. The Si—C bond constituting this ring-shaped structure is robust to make it difficult for C to be desorbed from Si.

Then, by supplying an $NH_3$ gas to the wafer 200 under the above-mentioned conditions, at least a part of the first layer can be modified (nitrided). As a result, it is possible to desorb Cl, H, etc. from the first layer and introduce N contained in the $NH_3$ gas into the first layer in a state where H is bonded to N. That is, it is possible to bond N contained in the $NH_3$ gas to Si constituting the ring-shaped structure included in the first layer in a state where H is bonded to N. The Si—N bonds in which N is bonded to Si in a NH bond state are weak, which makes it easy to desorb N from Si.

That is, by supplying the $NH_3$ gas to the wafer 200 under the above-mentioned conditions, it is possible to introduce (leave) at least a part of the ring-shaped structure included in the first layer into the second layer, with it preserved as it is without being destroyed. That is, nitriding of the first layer can be unsaturated (unsaturated nitridation) so as to leave at least a part of a plurality of ring-shaped structures included in the first layer as it is. As the first layer is nitrided, a silicon carbonitride layer (SiCN layer), which is a layer including the ring-shaped structure composed of Si and C and containing N, is formed as a second layer on the wafer 200. This SiCN layer is a layer containing Si, C and N and containing no O. In addition, C contained in the second layer is introduced into the second layer in a state of preserving the ring-shaped structure composed of Si and C, and N contained in the second layer is introduced into the second layer with N bonded to H. That is, C contained in the second layer is hardly desorbed due to a strong Si—C bond, and N contained in the second layer is easily desorbed due to a weak Si—N bond.

After forming the second layer on the wafer 200, the valve 243b is closed to stop the supply of $NH_3$ gas into the process chamber 201. Then, the gas remaining in the process chamber 201 is excluded from the process chamber 201 in the same procedure as the step 1.

An example of the nitriding agent (N-containing gas) may include a diazene ($N_2H_2$) gas, a hydrazine ($N_2H_4$) gas, a $N_3H_8$ gas or a gas containing these compounds, in addition to the $NH_3$ gas.

(Performing Predetermined Number of Times)

A cycle that non-simultaneously, i.e., without synchronization, performs the steps 1 and 2 is performed a predetermined number of times (n times, n is an integer of one or more) to thereby form a SiCN film, which is a film including the ring-shaped structure composed of Si and C and containing N, as a first film on the wafer 200. This SiCN film is a film containing Si, C and N and containing no O. This cycle may be repeated multiple times.

[Purging]

After the film forming step is completed, a $N_2$ gas is supplied from each of the gas supply pipes 232c and 232d into the process chamber 201 and is exhausted from the exhaust pipe 231. As a result, the interior of the process chamber 201 is purged to remove the gas, reaction by-products and the like remaining in the process chamber 201 from the interior of the process chamber 201.

(Post-Treatment Step)

After the purging of the interior of the process chamber 201 is completed, post-treatment is performed on the as-deposited SiCN film formed on the wafer 200 under an O-containing atmosphere. In the post treatment step, an $O_2$ gas is supplied to the wafer 200 to oxidize the first film including the ring-shaped structure composed of Si and C and containing N to thereby convert the first film into a second film including the ring-shaped structure composed of Si and C and containing O. The second film is a film containing Si, C and O, that is, a SiOC film.

The film forming step and the post-treatment step are carried out continuously in the same process chamber 201 without unloading the wafer 200 subjected to the film forming process from the process chamber 201 to the outside of the process chamber 201. That is, the film forming step and the post-treatment step are continuously performed in-situ.

That is, after the film forming step is completed and the purging of the interior of the process chamber 201 is completed, in a state where the wafer 200 subjected to the film forming process is accommodated in the process chamber 201, an $O_2$ gas is supplied to the wafer 200 in the process chamber 201, that is, the first film formed on the wafer 200. Specifically, the opening and closing control of the valves 243b to 243d is performed in the same procedure as the opening and closing control of the valves 243a, 243c and 243d in the step 1. The flow rate of the $O_2$ gas is adjusted by the MFC 241b, and the $O_2$ gas is supplied into the process chamber 201 via the nozzle 249b and is exhausted from the exhaust pipe 231. At this time, the $O_2$ gas is supplied to the wafer 200.

The process conditions of this step are exemplified as follows.

Processing temperature (second temperature): room temperature (25 degrees C.) to 600 degrees C.

Processing pressure: 0.5 to 760 Torr (67 to 101,325 Pa)

$N_2$ gas supply flow rate (per gas supply pipe): 0 to 10,000 sccm $O_2$ gas supply flow rate: 100 to 10,000 sccm The above-mentioned process conditions, particularly the temperature conditions (room temperature to 600 degrees C.), are the conditions that at least a part of the ring-shaped structure composed of Si and C included in the SiCN film formed in the film forming step can be preserved (maintained) without being destructed. That is, the above-mentioned process conditions are the conditions that at least a part of a plurality of ring-shaped structures included in the SiCN film on the wafer 200 is preserved as it is without being destructed.

That is, under the above-mentioned conditions, at least a part of the ring-shaped structure contained in the as-deposited SiCN film can be preserved without being destructed. That is, at least a part of the plurality of ring-shaped structures included in the as-deposited SiCN film can be left in the film as it is.

In addition, as described above, in the as-deposited SiCN film before the post-treatment, N is bonded, as NH, to Si constituting the ring-shaped structure in the film. Since the Si—N bond where N is bonded, as NH, to Si is weak, N is easily desorbed. In addition, since the Si—C bond constituting the ring-shaped structure in the SiCN film is strong, C is hardly desorbed.

That is, by subjecting the as-deposited SiCN film formed in the above-described film forming step to the post-treatment under the above-mentioned conditions, the SiCN film can be oxidized to substitute N contained in the SiCN film with O contained in the oxidizing agent, while preserving at least a part of the ring-shaped structure composed of Si and C included in the SiCN film. At this time, N contained in the SiCN film is desorbed from the film together with H. In this manner, by oxidizing the as-deposited SiCN film, it is possible to convert the SiCN film into a SiOC film. Then, as the SiCN film is converted into the SiOC film, the thickness of the SiOC film can be made thicker than the thickness of the SiCN film before the post-treatment, thereby increasing (expanding) a film thickness.

Figure 6A:
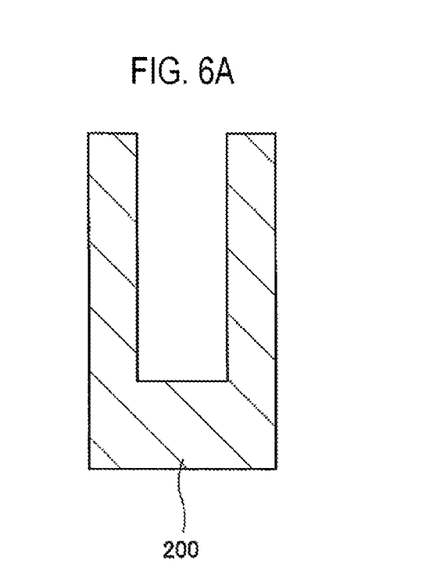
FIGS. 6A to 6C are enlarged sectional views of a wafer when a film forming process is performed so as to fill a recess formed in the surface of a wafer and FIG. 6D is an enlarged sectional view of the wafer when post-treatment is performed after the film forming process.
Figure 6B:
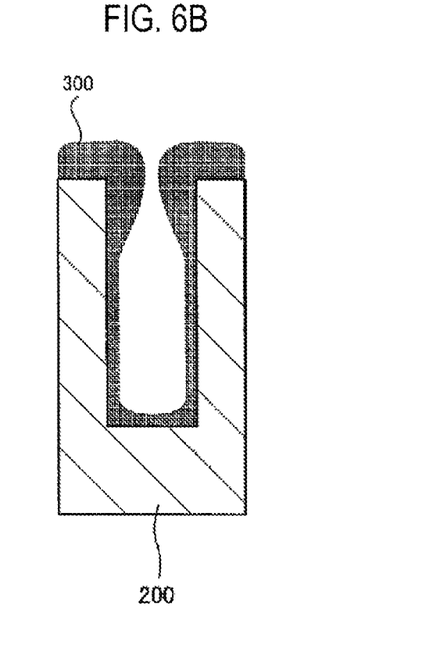
Figure 6C:
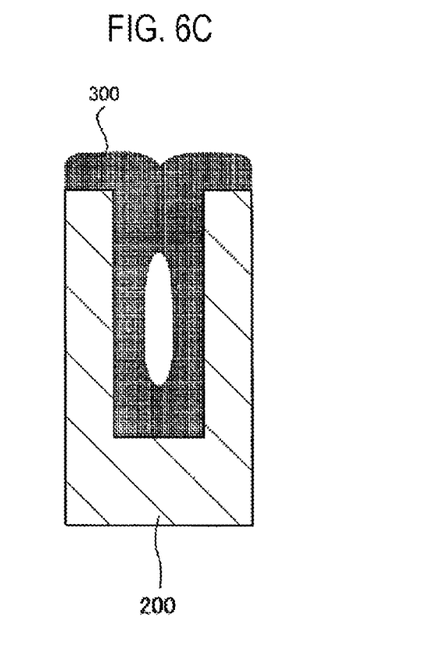

That is, when a SiCN film 300, which is a film including the ring-shaped structure composed of Si and C and containing N, is formed by performing the above-described film forming step so as to fill a recess formed in the surface of the wafer 200 as shown in FIGS. 6A to 6C, the opening of the recess is blocked and seams and voids are generated immediately after the film formation, as shown in FIG. 6C.

Figure 6D:
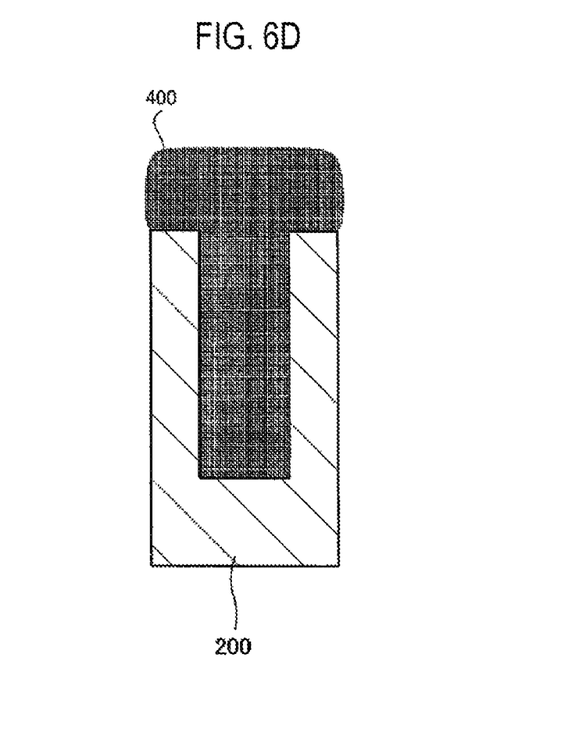

However, by carrying out the post-treatment after the film forming process, the SiCN film 300 having seams and voids formed so as to fill the recess in the surface of the wafer 200 can be oxidized to be converted (modified) into a SiOC film 400 while preserving at least a part of the ring-shaped structure composed of Si and C included in the SiCN film 300, thereby increasing (expanding) a film thickness, as shown in FIG. 6D. At this time, the seams and voids in the recess disappear, thereby forming a seamless and void-free film.

That is, by supplying an oxidizing agent to the as-deposited SiCN film for the post-treatment, the SiCN film having the seams or voids in the recess is converted into the SiOC film to have increased (expanded) thickness, so that the seams and voids disappear to form a seamless and void-free SiOC film in the recess.

The SiOC film formed by the post-treatment may contain less than about 5% of N components. Depending on the process conditions of the post-treatment, the N components in the SiOC film may be less than 1%. From this fact, this film may be also referred to as a SiOCN film. However, the concentration of N contained in the SiOCN film subjected to the post-treatment is an impurity level and is much lower than the concentration of N contained in the as-deposited SiCN film immediately after the film formation.

An example of the oxidizing agent ($O_2$-containing gas) may include water vapor ($H_2O$), an $O_2+H_2$ gas, a nitrous oxide ($N_2O$) gas, a nitrogen monoxide (NO) gas, a nitrogen dioxide ($NO_2$) gas, a hydrogen peroxide ($H_2O_2$) gas or an ozone ($O_3$) gas. When the $O_2+H_2$ gas is used as the oxidizing agent, a deuterium ($D_2$) gas or the like may be used instead of $H_2$ gas.

If the post-treatment is carried out using a plasma-excited $O_2$ gas ($O_2$*), oxygen radicals (O*), hydroxyl radicals (OH*) or the like as the oxidizing agent, since an oxidizing power of O*, OH* or the like is too strong, an underlying layer may be eroded (oxidized). In addition, the ring-shaped structure composed of Si and C in the film may be destroyed. By using an $O_2$ gas or the like having a relatively weak oxidizing power as the oxidizing agent, it is easy to prevent the underlying layer oxidation and preserve the ring-shaped structure composed of Si and C in the film without being destructed. Further, it is easy to improve the processing resistance of the formed film, particularly the wet etching resistance (HF (hydrogen fluoride) resistance).

(After-Purge Step and Atmospheric Pressure Returning Step)

After the post-treatment step is completed, a $N_2$ gas is supplied into the process chamber 201 from each of the gas supply pipes 232c and 232d and is exhausted from the exhaust pipe 231. Thus, the interior of the process chamber 201 is purged and the residual gas and the reaction by-products remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to atmospheric pressure (return to atmospheric pressure).

(Boat Unload and Wafer Discharge)

Thereafter, the seal cap 219 is moved down by the boat elevator 115 to open the lower end of the reaction tube 203. The post-treated wafers 200 supported by the boat 217 are unloaded from the lower end of the reaction tube 203 outside the reaction tube 203 (boat unload). The post-treated wafers 200 are unloaded from the reaction tube 203 and are discharged from the boat 217 (wafer discharge).

(3) Effects According to the Present Embodiment

According to the present embodiment, one or more effects set forth below may be achieved.

(a) In the film forming step, it is possible to include a ring-shaped structure composed of Si and C in the SiCN film formed on the wafer 200. As a result, a strong Si—C bond is introduced into the film, which makes it possible to make it difficult for C contained in the film to be desorbed.

(b) In the film forming step, it is possible to include N in the form of NH in the SiCN film formed on the wafer 200.

As a result, a weak Si—N bond is formed in the film, which makes it easy to desorb N contained in the film.

(c) In the post-treatment step, it is possible to maintain the ring-shaped structure composed of Si and C included in the SiCN film formed in the film forming step without being destructed. As a result, it is possible to substitute N contained in the film with O contained in the oxidizing agent in a state where the Si—C bond is preserved in the film.

(d) By carrying out the post-treatment step after the film forming step, since the SiCN film including the ring-shaped structure composed of Si and C is converted into a SiOC film including the ring-shaped structure composed of Si and C, thereby increasing (expanding) a film thickness, seams and voids in the film disappear, thereby forming a seamless and void-free SiOC film in the recess.

(e) The above-described effects can be also similarly obtained in a case of using a gas satisfying the above requirements other than the TCDSCB gas as the precursor gas. In addition, the above-described effects can be also similarly obtained in a case of using a nitriding agent other than the $NH_3$ gas, a case of using an oxidizing agent other than the $O_2$ gas, and a case of using an inert gas other than the $N_2$ gas.

Other Embodiments

While some embodiments of the present disclosure have been specifically described above, the present disclosure is not limited to the aforementioned embodiments but may be differently modified without departing from the subject matter of the present disclosure.

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied to, e.g., a case where films are formed using a single-wafer-type substrate processing apparatus capable of processing a single substrate or several substrates at a time. In addition, the example in which films are formed using a substrate processing apparatus provided with a hot-wall-type processing furnace has been described in the above embodiments. The present disclosure is not limited to the above embodiments but may be appropriately applied to a case where films are formed using a substrate processing apparatus provided with a cold-wall-type processing furnace.

The example in which the film forming step and the post-treatment step are continuously performed in-situ in the same treatment chamber has been described in the above embodiments. The present disclosure is not limited to the above embodiments but may be appropriately applied to a case where the film forming step and the post-treatment step are carried out ex-situ in different process chambers using a stand-alone type apparatus or a cluster type apparatus in which a plurality of process chambers are installed around a transfer chamber.

Even in the case of using these substrate processing apparatuses, film formation can be performed under the same processing procedures and processing conditions as in the above-described embodiments and modifications and the same effects as those of the above embodiments and modifications can be obtained.

In addition, the embodiments and modifications described above can be used in appropriate combination. The processing procedures and processing conditions at this time can be the same as the processing procedures and processing conditions of the above-described embodiments and modifications.

EXAMPLES

Hereinafter, examples will be described.

Example 1

As Sample 1, the substrate processing apparatus shown in FIG. 1 was used to form a SiOC film on a wafer according to the substrate processing sequence shown in FIG. 4. Sample 1 was prepared by continuously performing the film forming step and the post-treatment step. After the post-treatment step, the film thickness of the SiOC film formed on the wafer was measured. The process conditions were predetermined conditions within the process condition range in the above embodiments.

As Sample 2, the substrate processing apparatus shown in FIG. 1 was used to form a SiCN film on the wafer according to the film forming step of the substrate processing sequence shown in FIG. 4. Sample 2 was prepared using only the film forming step but not the post-treatment step. After the film forming step, the film thickness of the SiCN film formed on the wafer, that is, the as-deposited SiCN film, was measured. The process conditions were the same as the process conditions in the film forming step in preparing Sample 1.

Figure 7:
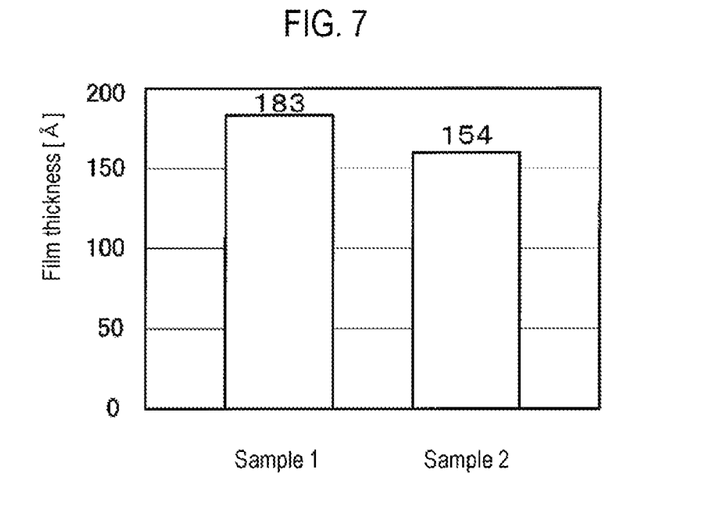
FIG. 7 is a view showing the comparison between film thickness of a film formed by performing a film forming process and post-treatment and film thickness immediately after a film is formed by the film forming process.

FIG. 7 shows measurement results of the film thicknesses of Samples 1 and 2. In FIG. 7, the vertical axis represents film thickness (Å), and the horizontal axis represents Samples 1 and 2. As shown in the figure, the film thickness of Sample 1 was 183 Å (18.3 nm), and the film thickness of Sample 2 was 154 Å (15.4 nm). That is, by performing the post-treatment after the film formation, it was confirmed that the film thickness was increased (expanded) by 29 Å (2.9 nm), that is, about 20%, as compared with before the post-treatment. The composition ratio of SiOC film of Sample 1 was 35% for Si, 42% for O, 22% for C and 1% for N. That is, although N was included in the SiOC film, it was confirmed that the concentration thereof was an impurity level.

That is, by forming the SiCN film under a condition that the ring-shaped structure composed of Si and C included in the precursor is preserved and carrying out the post-treatment under a condition that the ring-shaped structure included in the SiCN film is preserved, it was confirmed that N in the SiCN film was substituted with O to increase (expand) the film thickness.

Example 2

In Example 2, the substrate processing apparatus shown in FIG. 1 was used to fill a SiOC film in a trench having a width of about 9 nm to 60 nm and a depth of about 300 nm formed on the wafer surface according to the substrate processing sequence shown in FIG. 4. In Example 2, the film forming step and the post-treatment step were continuously performed. As a comparative example, the substrate processing apparatus shown in FIG. 1 was used to fill a SiCN film in a trench having a width of about 20 nm and a depth of about 300 nm formed on the wafer surface according to the substrate processing sequence shown in FIG. 4. In the comparative example, only the film forming step was performed but no post-treatment step was performed. Then, TEM images of the cross sections of the films after the filling were confirmed.

As a result, no seams and voids were observed in the SiOC film filled in the trench in Example 2. On the other hand, seams were observed in the SiCN film filled in the trench in the comparative example.

That is, in order to fill a recess such as a trench or a hole formed in the surface of the substrate, by forming a SiCN film under a condition that the ring-shaped structure composed of Si and C included in the precursor is preserved and carrying out the post-treatment under a condition that the ring-shaped structure included in the SiCN film is preserved, it was confirmed that a seamless and void-free SiOC film could be formed in the recess.

According to the present disclosure in some embodiments, it is possible to form a seamless and void-free film on a substrate with recesses such trenches and holes formed on its surface.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a first film including a ring-shaped structure composed of silicon and carbon and containing nitrogen so as to fill a recess formed in a surface of a substrate by performing a cycle a predetermined number of times, the cycle including non-simultaneously performing:
        supplying a precursor including the ring-shaped structure and containing halogen to the substrate with the recess formed in the surface; and
        supplying a nitriding agent to the substrate,
        wherein the cycle is performed under a condition that the ring-shaped structure included in the precursor is preserved; and
    performing post-treatment by supplying an oxidizing agent to the substrate under a condition that the ring-shaped structure included in the first film is preserved,
    wherein the act of performing the post-treatment includes oxidizing the first film to be converted into a second film including the ring-shaped structure and containing oxygen,
    wherein the act of forming the first film includes forming the first film having seams or voids, and
    wherein in the act of performing the post-treatment, the seams or voids of the first film are removed by converting the first film into the second film.

2. The method of claim 1, wherein the act of supplying the precursor includes forming a first layer including the ring-shaped structure and containing the halogen, and
    wherein the act of supplying the nitriding agent includes nitriding the first layer to be modified into a second layer including the ring-shaped structure and containing nitrogen.

3. The method of claim 1, wherein the nitriding agent contains nitrogen and hydrogen, and
    wherein the act of forming the first film includes introducing the nitrogen contained in the nitriding agent into the first film in a state where the hydrogen is bonded to the nitrogen.

4. The method of claim 1, wherein the act of performing the post-treatment includes substituting the nitrogen contained in the first film with the oxygen contained in the oxidizing agent.

5. The method of claim 1, wherein in the act of performing the post-treatment, the second film becomes thicker than the first film by converting the first film into the second film.

6. The method of claim 1, wherein the ring-shaped structure is composed of the silicon and the carbon which are alternately bonded to each other.

7. The method of claim 1, wherein the act of forming the first film and the act of performing the post-treatment are continuously performed in a same process chamber without unloading the substrate from an interior of the process chamber outside the process chamber.

8. The method of claim 1, wherein a processing temperature in the act of forming the first film is set to equal to or higher than 200 degrees C. and equal to or lower than 400 degrees C., and a processing temperature in the act of performing the post-treatment is set to equal to or higher than a room temperature and equal to or lower than 600 degrees C.

9. The method of claim 2, wherein the nitriding agent contains nitrogen and hydrogen, and
    wherein the act of supplying the nitriding agent includes introducing the nitrogen contained in the nitriding agent into the first layer in a state where the hydrogen is bonded to the nitrogen.

10. The method of claim 9, wherein the act of supplying the nitriding agent includes bonding the nitrogen contained in the nitriding agent to the silicon contained in the first layer in the state where the hydrogen is bonded to the nitrogen.

11. The method of claim 9, wherein the act of supplying the nitriding agent includes bonding the nitrogen contained in the nitriding agent to the silicon constituting the ring-shaped structure included in the first layer in the state where the hydrogen is bonded to the nitrogen.

12. The method of claim 6, wherein the ring-shaped structure includes four silicon-carbon bonds.

13. The method of claim 6, wherein the ring-shaped structure includes two silicon atoms and two carbon atoms.

14. The method of claim 6, wherein the ring-shaped structure composed of the silicon and the carbon is square.

15. The method of claim 6, wherein the halogen is bonded to the silicon in the ring-shaped structure included in the precursor.

16. The method of claim 6, wherein hydrogen is bonded to the carbon in the ring-shaped structure included in the precursor.

17. A substrate processing apparatus comprising:
a process chamber in which a substrate is processed;
a precursor supply system configured to supply a precursor including a ring-shaped structure composed of silicon and carbon and containing halogen to the substrate in the process chamber;
a nitriding agent supply system configured to supply a nitriding agent to the substrate in the process chamber;
an oxidizing agent supply system configured to supply an oxidizing agent to the substrate in the process chamber;
a heater configured to heat the substrate in the process chamber; and
a controller configured to control the precursor supply system, the nitriding agent supply system, the oxidizing agent supply system and the heater so as to perform a process in the process chamber, the process comprising:
forming a first film including the ring-shaped structure and containing nitrogen so as to fill a recess formed in a surface of the substrate by performing a cycle a predetermined number of times, the cycle including non-simultaneously performing:
supplying the precursor to the substrate with the recess formed in the surface; and
supplying the nitriding agent to the substrate;
wherein the cycle is performed under a condition that the ring-shaped structure included in the precursor is preserved; and
performing post-treatment by supplying the oxidizing agent to the substrate under a condition that the ring-shaped structure included in the first film is preserved,
wherein the act of performing the post-treatment includes oxidizing the first film to be converted into a second film including the ring-shaped structure and containing oxygen,
wherein the act of forming the first film includes forming the first film having seams or voids, and
wherein in the act of performing the post-treatment, the seams or voids of the first film are removed by converting the first film into the second film.

18. A non-transitory computer-readable storage medium storing a program that causes, by a computer, a substrate processing apparatus to perform a process in a process chamber of the substrate processing apparatus, the process comprising:
forming a first film including a ring-shaped structure composed of silicon and carbon and containing nitrogen so as to fill a recess formed in a surface of a substrate by performing a cycle a predetermined number of times, the cycle including non-simultaneously performing:
supplying a precursor including the ring-shaped structure and containing halogen to the substrate with the recess formed in the surface, and
supplying a nitriding agent to the substrate;
wherein the cycle is performed under a condition that the ring-shaped structure included in the precursor is preserved; and
performing post-treatment by supplying an oxidizing agent to the substrate under a condition that the ring-shaped structure included in the first film is preserved,
wherein the act of performing the post-treatment includes oxidizing the first film to be converted into a second film including the ring-shaped structure and containing oxygen,
wherein the act of forming the first film includes forming the first film having seams or voids, and
wherein in the act of performing the post-treatment, the seams or voids of the first film are removed by converting the first film into the second film.

* * * * *